(12) United States Patent
Sankarakrishnan et al.

(10) Patent No.: US 8,778,813 B2
(45) Date of Patent: Jul. 15, 2014

(54) CONFINED PROCESS VOLUME PECVD CHAMBER

(75) Inventors: Ramprakash Sankarakrishnan, San Jose, CA (US); Ganesh Balasubramanian, Sunnyvale, CA (US); Juan Carlos Rocha-Alvarez, San Carlos, CA (US); Dale R. Du Bois, Los Gatos, CA (US); Mark Fodor, Los Gatos, CA (US); Jianhua Zhou, San Jose, CA (US); Amit Bansal, Sunnyvale, CA (US); Mohamad A. Ayoub, Los Gatos, CA (US); Shahid Shaikh, Santa Clara, CA (US); Patrick Reilly, Dublin, CA (US); Deenesh Padhi, Sunnyvale, CA (US); Thomas Nowak, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 380 days.

(21) Appl. No.: 13/102,846

(22) Filed: May 6, 2011

(65) Prior Publication Data

US 2011/0294303 A1    Dec. 1, 2011

Related U.S. Application Data

(60) Provisional application No. 61/334,093, filed on May 12, 2010.

(51) Int. Cl.
| | |
|---|---|
| *H01L 21/31* | (2006.01) |
| *H01L 21/469* | (2006.01) |
| *H01L 21/00* | (2006.01) |
| *H01J 37/32* | (2006.01) |
| *C23C 16/46* | (2006.01) |
| *C23C 16/509* | (2006.01) |
| *H01L 21/67* | (2006.01) |
| *H01L 21/30* | (2006.01) |
| *H01L 21/42* | (2006.01) |
| *C23C 16/00* | (2006.01) |
| *B05C 11/11* | (2006.01) |

(52) U.S. Cl.
CPC ....... *H01L 21/6719* (2013.01); *H01J 37/32715* (2013.01); *H01J 37/32495* (2013.01); *C23C 16/46* (2013.01); *H01J 37/32651* (2013.01); *H01J 37/32568* (2013.01); *C23C 16/5096* (2013.01)
USPC .................. 438/771; 438/795; 257/E21.211; 257/E21.471; 118/723 E; 118/504

(58) Field of Classification Search
USPC ......... 438/758, 765–777, 788, 792, 795–799; 118/723 E, 504; 257/E21.158, E21.211, 257/E21.212, E21.218, E21.311, 257/E21.471–E21.488
See application file for complete search history.

(56) References Cited

U.S. PATENT DOCUMENTS 6,079,356 A    6/2000 Umotoy et al.
6,916,399 B1 *  7/2005 Rozenzon et al. ....... 156/345.37

(Continued)

OTHER PUBLICATIONS

International Search Report and Written Opinion in International Application No. PCT/US2011/035534 mailed Mar. 20, 2012.

*Primary Examiner* — Calvin Choi
(74) *Attorney, Agent, or Firm* — Patterson & Sheridan, LLP

(57) ABSTRACT

An apparatus for plasma processing a substrate is provided. The apparatus comprises a processing chamber, a substrate support disposed in the processing chamber, a shield member disposed in the processing chamber below the substrate support, and a lid assembly coupled to the processing chamber. The lid assembly comprises a conductive gas distributor coupled to a power source, and an electrode separated from the conductive gas distributor and the chamber body by electrical insulators. The electrode is also coupled to a source of electric power. The substrate support is formed with a stiffness that permits very little departure from parallelism. The shield member thermally shields a substrate transfer opening in the lower portion of the chamber body. A pumping plenum is located below the substrate support processing position, and is spaced apart therefrom.

17 Claims, 3 Drawing Sheets

(56) References Cited

U.S. PATENT DOCUMENTS

2006/0037537 A1    2/2006   Lombardi et al.
2007/0246743 A1*  10/2007   Cho et al. .................... 257/202
2009/0032190 A1*   2/2009   Takahashi ............... 156/345.33
2009/0155452 A1*   6/2009   Kim et al. ......................... 427/8
2009/0223930 A1*   9/2009   Kwon et al. ..................... 216/67
2009/0236214 A1    9/2009   Janakiraman et al.
2009/0242134 A1*  10/2009   Iwata ....................... 156/345.48

* cited by examiner exposed to plasma, non-uniformity may also be caused by reactive chemistry between the plasma and the chamber components. Such chemistry may be reduced by providing chamber components with resistance to the chemistry. Exposed conductive surfaces may be coated with a non-reactive conductive material or a resistant material through which electricity is conducted by a tunneling mechanism.

CONFINED PROCESS VOLUME PECVD CHAMBER

CROSS-REFERENCE TO RELATED APPLICATIONS

This application claims benefit of U.S. provisional patent application Ser. No. 61/334,093, filed May 12, 2010, which is herein incorporated by reference.

FIELD

Embodiments described herein relate to semiconductor manufacturing apparatus and methods. Specifically, embodiments described herein relate to plasma processing chambers for semiconductor substrates.

BACKGROUND

For over 50 years, the number of transistors formed on an integrated circuit has doubled approximately every two years. This two-year-doubling trend, also known as Moore's Law, is projected to continue, with devices formed on semiconductor chips shrinking from the current critical dimension of 20-30 nm to below 100 Angstroms in future fabrication processes currently being designed. As device geometries shrink, fabrication geometries grow. As the 300 mm wafer replaced the 200 mm wafer years ago, the 300 mm wafer will shortly be replaced by the 400 mm wafer. With processing of large area semiconductor substrate growing in sophistication, even larger fabrication geometries for logic chips may be within reach.

Uniformity in processing conditions has always been important to semiconductor manufacturing, and as critical dimensions of devices continue to decline and fab geometries increase, tolerance for non-uniformity also declines. Non-uniformity arises from numerous causes, which may be related to device properties, equipment features, and the chemistry and physics of fabrication processes. As the semiconductor manufacturing industry progresses along Moore's Law, there is a continuing need for fabrication processes and equipment capable of very uniform processing.

SUMMARY

Embodiments described herein provide an apparatus for processing a semiconductor substrate, the apparatus having a processing chamber that has a chamber body with a substrate transfer opening, a substrate support disposed in the processing chamber and defining an upper portion of the processing chamber and a lower portion of the processing chamber, a lid assembly comprising a conductive gas distributor coupled to RF power and a powered electrode insulated from the conductive gas distributor, and a shield member disposed in the lower portion of the processing chamber, the shield member being positionable inside the processing chamber by an extension of the shield member outside the processing chamber.

Other embodiments provide a lid assembly for a semiconductor processing chamber, with a gas distributor having a back electrode, a gas box, and a face plate, an annular tuning electrode separated from the face plate of the gas distributor by an insulator ring, and a lid plate coupled to a sidewall of the processing chamber and separated from the tuning electrode by an isolator.

Other embodiments provide a shield for a semiconductor processing chamber, the shield featuring a plate having a shape similar to a cross-sectional shape of the processing chamber, with an opening in the plate for a shaft portion of a substrate support disposed in the processing chamber, an opening in the plate for a lift pin portion of the substrate support, and an extension attached to the plate and extending outside the processing chamber for moving the shield between a substrate processing position and a substrate transfer position within the processing chamber.

Other embodiments provide a method of processing a substrate by disposing the substrate on a substrate support in a processing chamber, coupling RF power to a conductive gas distributor opposite the substrate support, providing an electrode in a side wall of the chamber proximate the conductive gas distributor, moving the substrate support into a processing position proximate the electrode, flowing a processing gas through the gas distributor into a processing region between the conductive gas distributor and the substrate support, forming a plasma from the processing gas, and shaping the plasma by applying an electric potential to the electrode.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
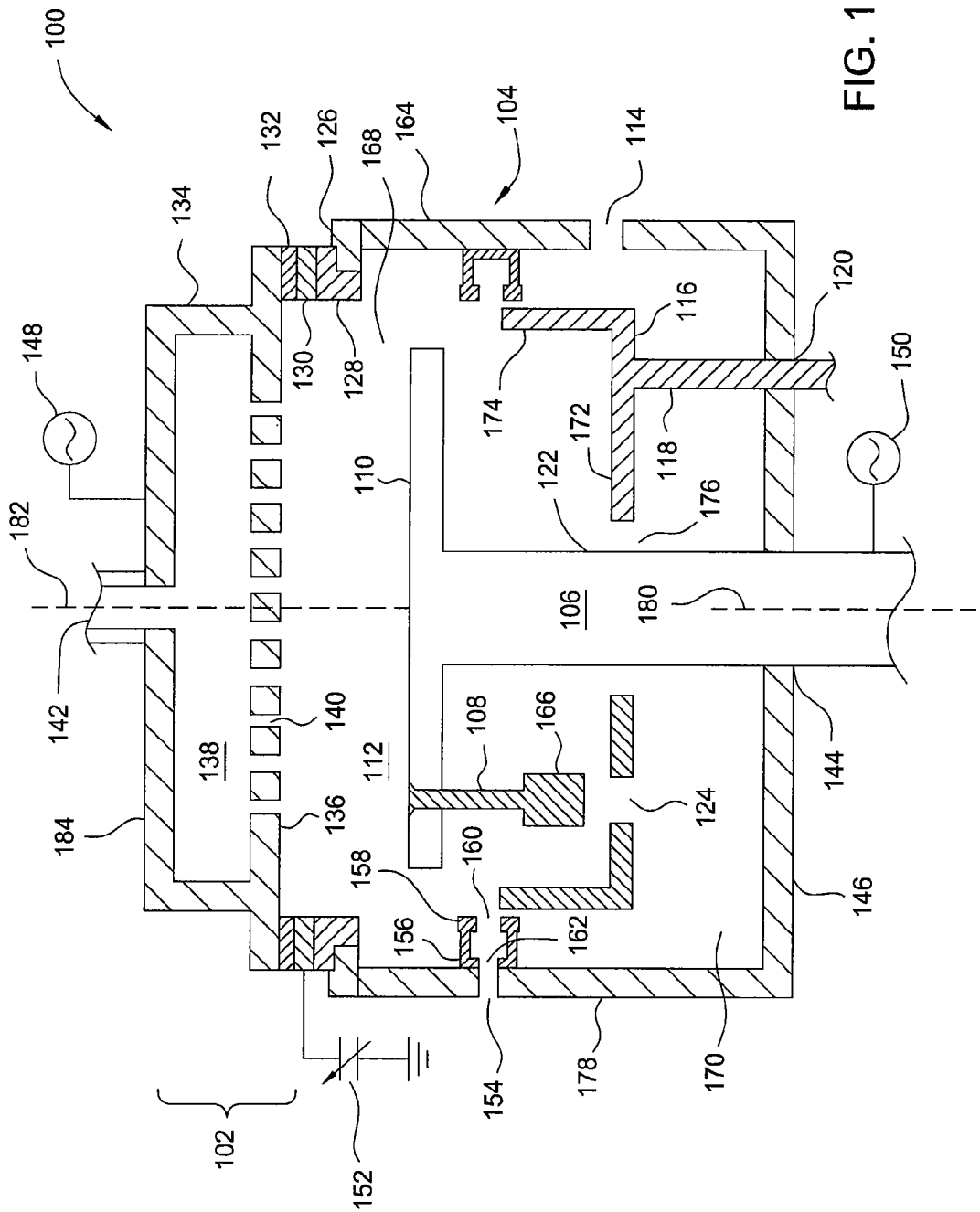
FIG. 1 is a schematic cross-sectional view of an apparatus according to one embodiment.

Embodiments described herein provide an apparatus for processing a semiconductor substrate. FIG. 1 is a schematic cross-sectional view of an apparatus 100 according to one embodiment. The apparatus 100 of FIG. 1 comprises a processing chamber 104 with a conductive chamber body 164 that has a substrate transfer opening 114 disposed in a side wall thereof. The substrate transfer opening 114 allows substrates to be transferred into and out of the processing chamber 104. In many embodiments, a substrate handling device, such as a robot (not shown), enters the processing chamber 104 through the substrate transfer opening 114 to deposit a substrate in the processing chamber 104 or to remove a substrate from the processing chamber 104.

The chamber body 164 comprises a conductive side wall 178 and bottom wall 146, which may be aluminum or stainless steel, or any other conductive material such as metal or a metal alloy. The interior surface of the chamber body 164 may be coated with a resistant material to reduce chemical attack on the chamber body 164. A removable liner may also be used. The coating or liner may be a ceramic material, such as a metal oxide, for example alumina or yttria, or a resistant metal such as titanium, or any convenient combination thereof.

The apparatus 100 further comprises a substrate support 106 disposed in the chamber. The substrate support 106 has a support surface 110 on which a substrate may be disposed for processing. One or more lift pins 108 extend through the substrate support 106 to the support surface 110, and extend below the support surface 110 to a base 166. The substrate support 106 has a shaft portion 122 that extends through an opening 144 in the bottom wall 146 of the chamber body 164 and couples to an actuator (not shown) that moves the substrate support 106 inside the processing chamber 104 such that the support surface 110 moves closer or further from the bottom wall 146. As the support surface 110 is moved closer to the bottom wall 146, the base 166 of the lift pin 108 engages the bottom wall 146, and a top portion of the lift pin 108 extends above the support surface 110. Usually, a plurality of lift pins 108 are provided to lift a substrate above the support surface 110 as the lift pins 108 extend above the support surface 110. In the cross-sectional view of FIG. 1, only one lift pin 108 is visible. The substrate support 106 generally defines an upper portion 168 of the processing chamber 104, including a processing zone 112, and a lower portion 170 of the processing chamber 104.

The apparatus 100 further comprises a shield member 116 disposed in the lower portion 170 of the processing chamber 104. The shield member 116 comprises a thermally insulating material, such as ceramic, glass, quartz, plastic, or similar materials, including mixtures, composites, or combinations thereof. The shield member 116 comprises an extension 118 through a second opening 120 in the bottom wall 146 that couples to a second actuator (not shown) for positioning the shield member 116 inside the processing chamber 104. The shield member 116 creates a thermal shield between the processing zone 112 and the substrate transfer opening 114 that prevents heat loss through the substrate transfer opening 114, improving thermal uniformity in the processing chamber 104 during processing. The shield member 116 generally shields the entire lower portion 170 of the processing chamber 104 to prevent thermal disturbance of the processing zone 112 from any heat loss feature in the lower portion 170 of the processing chamber 104. During a substrate loading or unloading operation, the shield member 116 and the substrate support 106 move into a position below the substrate transfer opening 114 allowing access to the support surface 110. During processing, the substrate support 106 moves the support surface 110 to the processing zone 112, and the shield member 116 moves to a position proximate a pumping plenum 156 disposed along a side wall 178 of the processing chamber 104.

The pumping plenum 156 is a ring-like channel disposed along the side wall 178 of the processing chamber. An opening 160 in an inner extent 158 of the pumping plenum 156 admits process gases from the processing zone 112 of the chamber into the channel. The process gases flow around the channel to a portal 162 in the pumping plenum 156 that mates with a similar portal 154 in the side wall 178 of the processing chamber 104 to evacuate process gases from the chamber 104. The opening 160 may be an annular groove or slit along the entire pumping plenum 156 or a series of discrete openings regularly spaced around the pumping plenum 156. The opening 160 may be continuous or discontinuous, and may be sized to provide a pressure drop for uniform gas flow into the pumping plenum 156.

The shield member 116 comprises a plate portion 172 and a wall portion 174. The plate portion 172 has a first opening 176 to admit the shaft portion 122 of the substrate support 106 and a second opening 124 to admit the base portion 166 of the lift pin 108. When processing a substrate, the wall portion 174 is positioned proximate to a lower extent of the opening or openings 160 to effectively shield the processing zone 112 from thermal disturbance. In an alternate embodiment, the shield member 116 may be formed without the wall portion 174. In such an embodiment, the shield member 116 may be a thermally insulating plate that moves to a position proximate a lower surface of the pumping plenum 156, and may contact the lower surface of the pumping plenum 156 in some embodiments.

The apparatus 100 further comprises a lid assembly 102 that is coupled to the side wall 178 of the processing chamber 104 by a lid plate 126. The lid assembly 102 comprises a gas distributor 134 that has a back electrode 184 and a face plate 136 that together define a gas box 138. The face plate 136 has a plurality of openings 140 to admit process gases into the processing zone 112. The gas distributor 134 is conductive and may be made of aluminum, stainless steel, titanium, or another conductive material such as a metal or alloy. A surface of the face plate 136 that faces the processing zone 112 may be coated with a resistant material such as ceramic or a resistant metal to reduce chemical attack. The gas distributor 134 is coupled to a source of RF power 148 for generating ionized gas in the gas box 138 and/or in the processing zone 112. The face plate 136 extends beyond the processing zone 112 in a lateral direction so that the portion of the face plate 136 exposed to the processing zone 112 is uniformly flat across the entire processing zone 112. The flat face plate 136 improves uniformity of the electric field produced in the processing zone 112 by RF coupling to the gas distributor 134.

The face plate 136 is formed to a thickness that enhances thermal conduction through the face plate 136. Enhanced thermal conduction improves temperature uniformity across the face plate 136, and therefore throughout the processing zone 112. In a deposition process wherein the substrate support is heated to a temperature of 300° C. to 500° C., a face plate 136 having the above dimensions made of aluminum will have a temperature difference from a central region of the face plate to a peripheral region of the face plate less than about 20° C., such as less than about 15° C., for example 13° C.

The lid assembly 102 further comprises an electrode 130 electrically insulated from the gas distributor by an insulator 132. The electrode 130 is an annular conductive member disposed between the insulator 132 and a second insulator 128 that insulates the lid assembly 102 from the side wall 178 of the processing chamber 104. The electrode 130 may be annular, ring-like, or torroidal, and generally has a uniform cross-sectional shape to maximize uniformity of the electric field produced by the electrode 130. The electrode 130 is coupled to a source of electric power 142, which is shown in the embodiment of FIG. 1 as a DC power source, but may also be an RF bias source. The electrode 130 allows an electric potential to be established in the processing zone 112 to shape the incumbent ionized gas or plasma. As the electric potential of the electrode 130 is changed, ions or electrons from the gas are incrementally attracted to the electrode 130, and the density profile of the ionized gas or plasma across the support surface 110 of the substrate support 106 may be adjusted to promote deposition uniformity.

The processing zone 112 is defined by the support surface 110 of the substrate support 106, the face plate 136 of the gas distributor 134, and the side ring stack comprising the two insulators 132 and 128 and the electrode 130. During processing, the substrate support 106 moves to a position proximate the insulator 128 and/or the electrode 130, and the support surface 110 forms a floor for the processing zone 112. Process gases exit the processing zone at the edge of the support surface 110 and flow toward the pumping plenum 156, which is below and spaced apart from the support surface 110. Locating the processing zone 112 away from the chamber body 164 by moving the processing zone 112 into the lid assembly 102 reduces contact between process gases and chamber body surfaces, lowering the rate of chemical attack on the chamber body surfaces. Reducing exposure of the plasma or ionized gas to the conductive chamber side walls also reduces the opportunity for intermittent grounding by discharge to the chamber side wall.

The electrode 130 is conductive, and is generally a metal or metal alloy. Although the electrode 130 is shown as a ring with a surface that faces the processing zone 112 and is exposed to process gases, the electrode may be shielded from the process environment by providing a single insulator having a continuous process-facing surface in place of the two insulators 128 and 132, and by forming the electrode 130 in an internal channel of the single insulator, or by forming a channel around an outer extent of the single insulator for inserting the electrode. Such embodiments would enable use of an electric potential to control the plasma profile without exposing the electrode to the process environment. In other embodiments, the surface of the electrode 130 facing the processing environment may be coated with a resistant material, such as a ceramic or resistant metal.

The substrate support 106 is oriented such that a central axis 180 of the substrate support 106 is substantially parallel to a central axis 182 of the processing chamber 104. The substrate support 106 has a stiffness that limits departure from axis parallelism to less than about 1%, for example less than about 0.5%, such as less than about 0.1%, or between about 0.01% and about 1%, for example between about 0.05% and about 0.5%, such as about 0.07%. The substrate support 106 thus tilts no more than about 0.01 inches per inch of travel (in/in), for example less than about 0.005 in/in, such as about 0.0007 in/in.

The stiffness of the substrate support 106 provides uniform distance between the support surface 110 of the substrate support 106 and the face plate 136 of the gas distributor 134. The uniform distance promotes uniformity in the electric field formed between the face plate 136 and the support surface 110 of the substrate support 106, improving plasma density uniformity throughout the processing zone 112. The substrate support 106 may be coupled to a source of RF power 150 as well to facilitate control of plasma properties in the processing zone 112. The two plasma sources 148 and 150 may be tuned to two different frequencies, for example, to promote ionization of multiple species in the processing zone 112.

Stiffness of the substrate support 106 may be selected by selecting the thickness of the shaft portion 122. In many embodiments, the shaft portion 122 of the substrate support 106 comprises conduits of various types for gases, liquids, or electrical elements. Stiffness of the shaft portion 122 is primarily influenced by the width of the solid portions of the shaft portion 122. Thus, increasing the general mass of the shaft portion 122 will increase its stiffness.

The lid assembly 102, substrate support 106, and shield member 116 of FIG. 1 may be used with any processing chamber for plasma or thermal processing. One example of a plasma processing chamber with which the lid assembly 102, substrate support 106, and shield member 116 may be beneficially used is the PRODUCER® platform and chambers available from Applied Materials, Inc., located in Santa Clara, Calif. Chambers from other manufacturers may also be used with the components described above.

Figure 2:
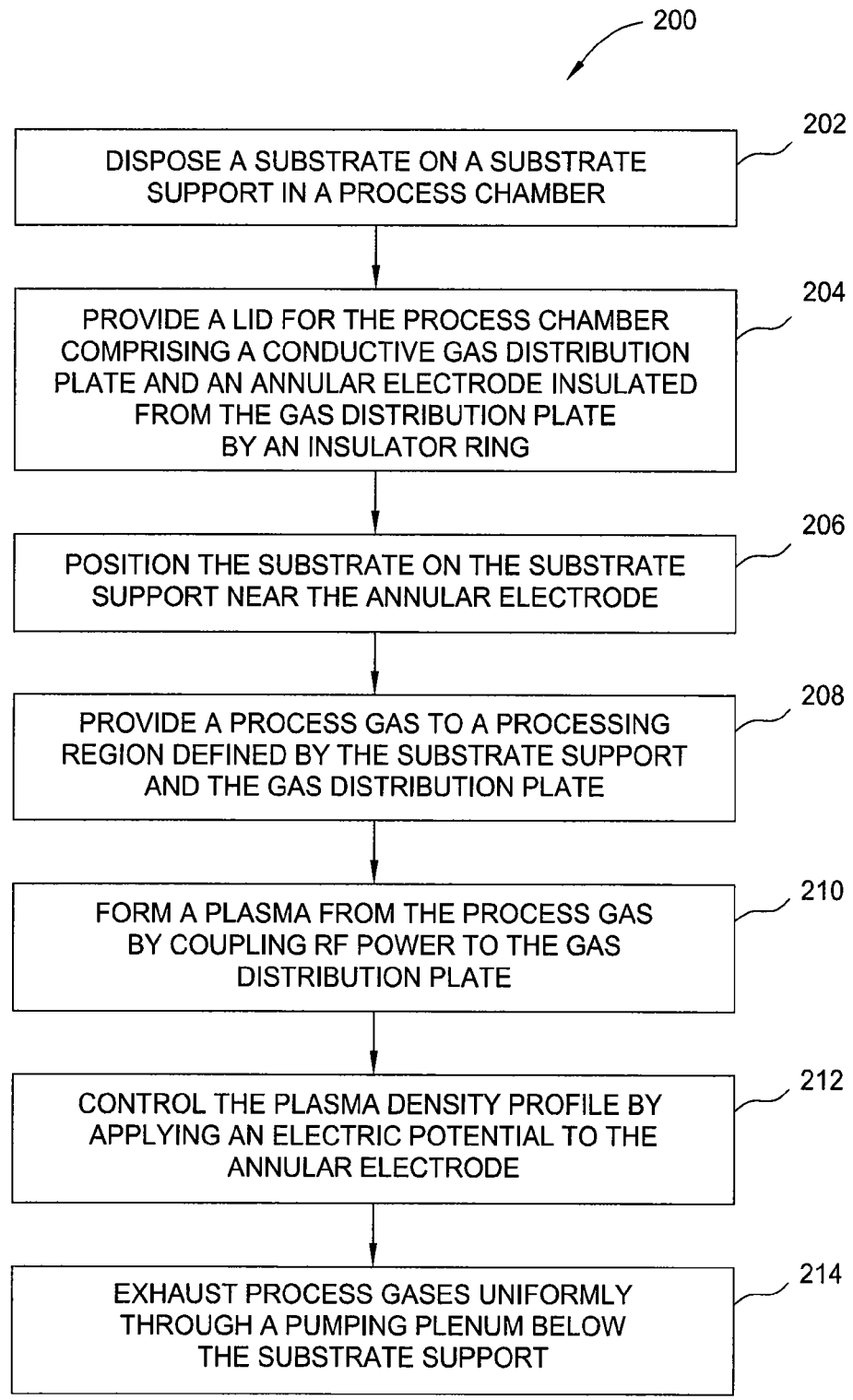
FIG. 2 is a flow diagram summarizing a method according to another embodiment.

FIG. 2 is a flow diagram summarizing a method 200 according to another embodiment. The method of FIG. 2 may be performed using any substrate processing chamber suitably configured for plasma processing, including embodiments of the apparatus 100 of FIG. 1. At 202, a substrate is disposed on a substrate support in a processing chamber. At 204, the chamber is provided with a lid comprising a conductive gas distribution plate and an electrode disposed around the side wall of the lid below the gas distribution plate. The electrode may be insulated from the gas distribution plate by an insulator ring, and both may be annular.

At 206, the substrate is positioned near the electrode for processing. The substrate support may be moved in any convenient manner. In some embodiments, the substrate support and the gas distribution plate define a processing region that is maintained away from other chamber components to reduce the instance of plasma arcing and chemical attack on the other chamber components. In some embodiments, a second insulator ring may be provided between the lid and the chamber body. The insulator rings generally form a chemically resistant side wall for the processing zone. The gas distribution plate and the electrode may also be coated with a resistant material in some embodiments.

The substrate is positioned such that an edge of the substrate is proximate the electrode. The distance from the substrate edge to the electrode will generally be less than about 10 mm. The distance may be between about 2 mm and about 10 mm, for example between about 4 mm and about 6 mm, such as about 6 mm. In some embodiments, the gap between the substrate edge and the electrode may be sized to provide flow uniformity at all points along the edge of the substrate.

At 208, a process gas, which may be a mixture, is provided to the processing region defined by the substrate support and the gas distribution plate. The process gas generally flows through openings in the gas distribution plate that may be shaped in any convenient manner to achieve desired flow characteristics. At 210, a plasma is formed from the process gas in the processing region by coupling RF power to the gas distribution plate. RF power may also be coupled to the substrate support to produce an electrical bias on the substrate or to encourage further ionization of the process gas.

At 212, an electric potential is applied to the electrode to control the plasma density profile across the substrate support. Adjusting the potential of the electrode with respect to the substrate support and the gas distribution plate adjusts the distance between the plasma sheath and the side wall of the chamber or the processing region such that exposure of a substrate to the plasma can be controlled to the edge of the substrate. Minimizing geometrical discontinuities of the various conductive components also improves plasma density uniformity control in the processing region.

At 214, exhaust gases are uniformly exhausted through a pumping plenum located below the substrate support in a lower portion of the chamber. The pumping plenum is structured to provide a uniform gas flow across the substrate support, over the edge thereof and into the lower portion of the chamber, and into the pumping plenum. Providing a pumping plenum below the substrate support reduces gas flow anomalies due to operation of the pumping plenum. Distance between the processing region and the pumping plenum may be adjusted by spacing the lid of the processing chamber a desired distance from the pumping plenum, and then positioning the substrate proximate the lid for processing.

The method 200 of FIG. 2 may be used for any plasma process performed in a capacitative plasma chamber. For example, deposition processes wherein layers containing silicon, oxygen, carbon, nitrogen, or other elements are formed by plasma CVD may benefit from the uniformity enhancement of the method 200. A plasma may be formed from a process gas containing inert or non-reactive gases such as argon or helium, as well as gases containing silicon, carbon, oxygen, nitrogen, or other elements. A DC electric potential between about +10 V and +100 V, such as between about +30 V and about +70 V, for example +50V, may be applied to the electrode to attract the electrons that form the plasma sheath to expand toward the electrode.

In some embodiments, the method 200 may further comprise thermally shielding portions of the processing chamber prone to heat loss. For example, a thermal shield may be disposed in a lower portion of the chamber to shield an access port formed in one wall of the chamber. The thermal shield reduces heat loss from the chamber through any shielded portions of the chamber wall.

Figure 3:
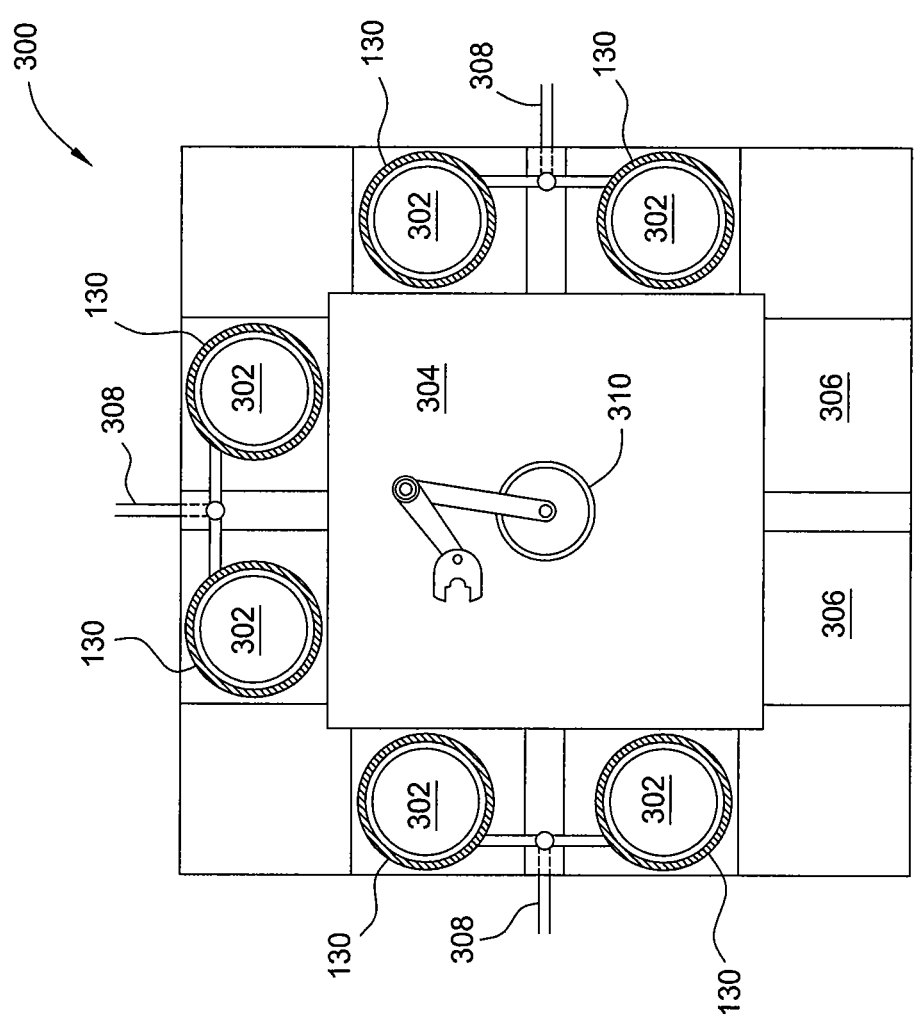
FIG. 3 is a schematic top view of an apparatus according to another embodiment.

FIG. 3 is a schematic top view of an apparatus 300 according to another embodiment. The apparatus 300 comprises a plurality of processing chambers 302, a substrate transfer chamber 304, a substrate handler 310, and one or more load lock chambers 306. The substrate handler 310 may be any suitably designed robot. In one embodiment, the substrate handler 310 comprises two linked tandem-blade robots that simultaneously access two adjacent processing chambers 302. One or more of the processing chambers 302 of the apparatus 300 may be similar to the chamber 100. Each of the processing chambers 302 has a tuning electrode 130 as described above in connection with the apparatus of FIG. 1. The apparatus 300 also comprises a plurality of gas exhaust conduits 308, each in fluid communication with a pumping plenum such as the pumping plenum 156 described in connection with FIG. 1 above, and one conduit 308 for each pair of processing chambers 302. In addition to plasma processing chambers such as the chamber 100, other types of chambers may be included in the apparatus 300 of FIG. 3. For example, one or more of the processing chambers 302 may be a thermal treatment chamber, cleaning chamber, UV treatment chamber, cool-down or rest chamber.

While the foregoing is directed to embodiments of the invention, other and further embodiments of the invention may be devised without departing from the basic scope thereof.

What is claimed is:

1. An apparatus for processing a semiconductor substrate, comprising:
    a processing chamber having a chamber body;
    a substrate support disposed in the processing chamber and defining an upper portion of the processing chamber and a lower portion of the processing chamber;
    a lid assembly coupled to the chamber body, the lid assembly comprising a conductive gas distributor coupled to RF power and a powered electrode insulated from the conductive gas distributor, wherein the powered electrode is disposed between a first insulator and a second insulator, wherein the first insulator insulates the powered electrode from the conductive gas distributor, and wherein the second insulator insulates the powered electrode from the chamber body; and
    a shield member disposed in the lower portion of the processing chamber, the shield member being positionable inside the processing chamber by an extension of the shield member outside the processing chamber.

2. The apparatus of claim 1, wherein the lid assembly defines a processing zone.

3. The apparatus of claim 1,
    wherein the chamber body has a substrate transfer opening;
    wherein the shield member is movable between a substrate processing position and a substrate transfer position; and
    wherein the shield member covers the substrate transfer opening when the shield member is positioned in the substrate processing position.

4. The apparatus of claim 1, wherein the substrate support tilts less than about 0.1%.

5. The apparatus of claim 1, wherein
    the lid assembly defines a processing zone adjacent to the powered electrode;
    wherein the shield member is movable between a substrate processing position and a substrate transfer position;
    wherein the chamber body has a substrate transfer opening; and
    wherein the shield member covers the substrate transfer opening when the shield member is positioned in the substrate processing position.

6. The apparatus of claim 1, further comprising a pumping plenum disposed about a wall of the chamber body and comprising an annular opening with a lower surface and an upper surface, wherein an upper surface of the shield member is substantially even with the lower surface of the pumping plenum when the shield member is in a substrate processing position.

7. The apparatus of claim 6, wherein the chamber body has a substrate transfer opening and wherein the substrate transfer opening is below the pumping plenum, and the shield member exposes the substrate transfer opening when the shield member is positioned in a substrate transfer position.

8. The apparatus of claim 1,
    wherein the conductive gas distributor comprises a back electrode, a gas box, and a face plate;
    wherein the powered electrode is an annular tuning electrode separated from the face plate of the conductive gas distributor by an insulator ring; and
    wherein the lid assembly further comprises a lid plate coupled to a sidewall of the processing chamber and separated from the powered electrode by an isolator.

9. The apparatus of claim 8, wherein the lid assembly defines a processing zone adjacent to the annular tuning electrode.

10. The apparatus of claim 8, wherein the conductive gas distributor and the powered electrode are each coupled to a source of electric power.

11. The apparatus of claim 10, wherein the conductive gas distributor is coupled to a source of RF power and the powered electrode is coupled to a source of DC power.

12. The apparatus of claim 9, wherein the powered electrode has an upper surface that is substantially even with a lower extent of the processing zone.

13. The apparatus of claim 1, wherein the shield member further comprises:
    a plate having a shape similar to a cross-sectional shape of the processing chamber;
    an opening in the plate for a shaft portion of a substrate support disposed in the processing chamber;
    an opening in the plate for a lift pin portion of the substrate support; and
    wherein the extension of the shield member extends from the plate to outside the processing chamber.

14. The apparatus of claim 13, wherein the plate comprises a thermally insulating material, and a distance from the center to the edge of the plate is substantially equal to a distance from a center axis of the processing chamber to an inner edge of a pumping plenum disposed around a wall of the processing chamber.

15. The apparatus of claim 14, further comprising an actuator coupled to the extension for moving the shield member within the processing chamber.

16. The apparatus of claim 14, further comprising a wall extending from an edge of the plate.

17. The apparatus of claim 1, wherein the conductive gas distributor is positioned opposite the substrate support.

* * * * *